(12) United States Patent
Specht et al.

(10) Patent No.: US 7,157,767 B2
(45) Date of Patent: Jan. 2, 2007

(54) SEMICONDUCTOR MEMORY ELEMENT, SEMICONDUCTOR MEMORY ARRANGEMENT, METHOD FOR FABRICATING A SEMICONDUCTOR MEMORY ELEMENT AND METHOD FOR OPERATING A SEMICONDUCTOR MEMORY ELEMENT

(75) Inventors: Michael Specht, München (DE); Franz Hofmann, München (DE)

(73) Assignee: Infineon Technologies AG, Munich (DE)

( * ) Notice: Subject to any disclaimer, the term of this patent is extended or adjusted under 35 U.S.C. 154(b) by 159 days.

(21) Appl. No.: 10/486,184

(22) PCT Filed: Sep. 2, 2002

(86) PCT No.: PCT/DE02/03220

§ 371 (c)(1),
(2), (4) Date: Oct. 25, 2004

(87) PCT Pub. No.: WO03/026014

PCT Pub. Date: Mar. 27, 2003

(65) Prior Publication Data

US 2005/0040456 A1  Feb. 24, 2005

(30) Foreign Application Priority Data

Sep. 4, 2001  (DE) .............................. 101 43 235

(51) Int. Cl.
*H01L 29/788* (2006.01)
(52) U.S. Cl. .................. 257/315; 257/314; 257/320
(58) Field of Classification Search ............... 257/315, 257/314, 316, 318
See application file for complete search history.

(56) References Cited

U.S. PATENT DOCUMENTS 5,679,970 A * 10/1997 Hartmann .................. 257/320
5,763,913 A     6/1998 Jeong

FOREIGN PATENT DOCUMENTS

EP   0 843 360   5/1998
EP   0 935 291   8/1999

* cited by examiner

*Primary Examiner*—David Nelms
*Assistant Examiner*—Thinh T Nguyen
(74) *Attorney, Agent, or Firm*—Dicke, Billig & Czaja, PLLC

(57) ABSTRACT

A semiconductor memory element has a substrate, in which a source region and a drain region are formed, a floating gate electrically insulated from the substrate, and a tunnel barrier arrangement, via which charging or discharging of the floating gate can be performed. It is possible to alter the conductivity of a channel between source and drain regions by charging or discharging the floating gate. A source line is electrically conductively connected to the source region and controls the charge transmission of the tunnel barrier arrangement.

18 Claims, 6 Drawing Sheets

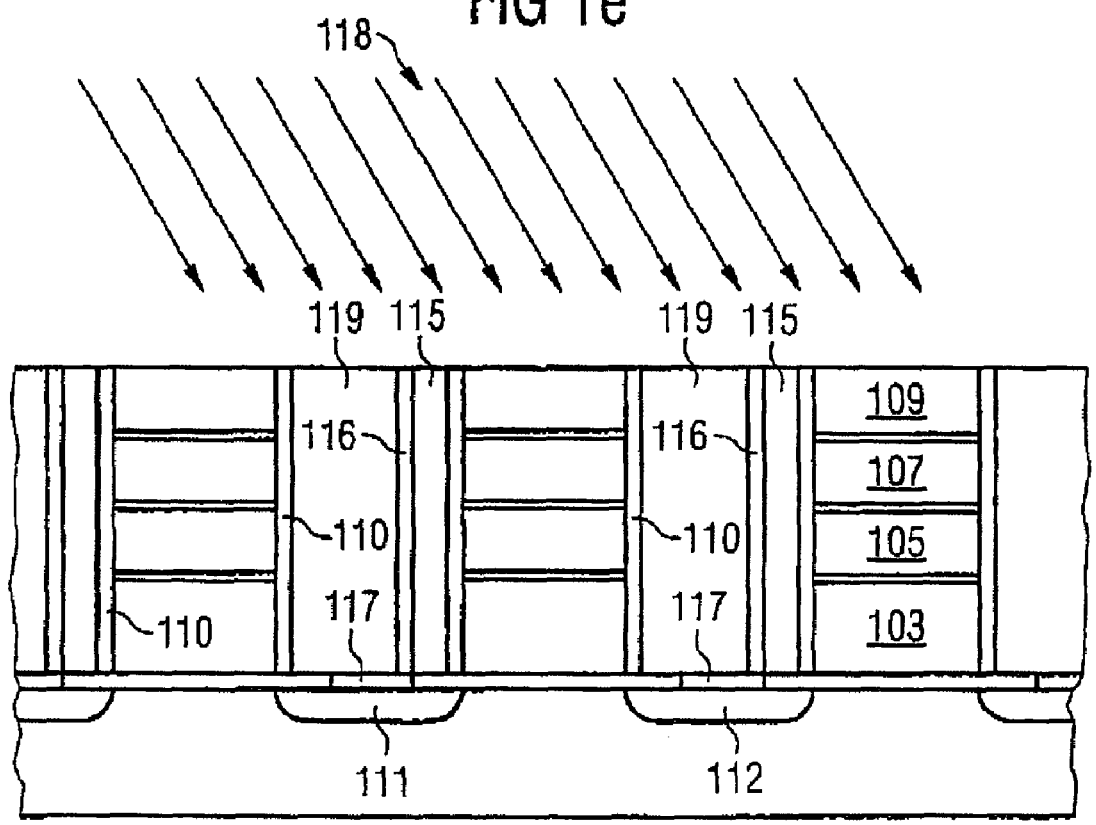
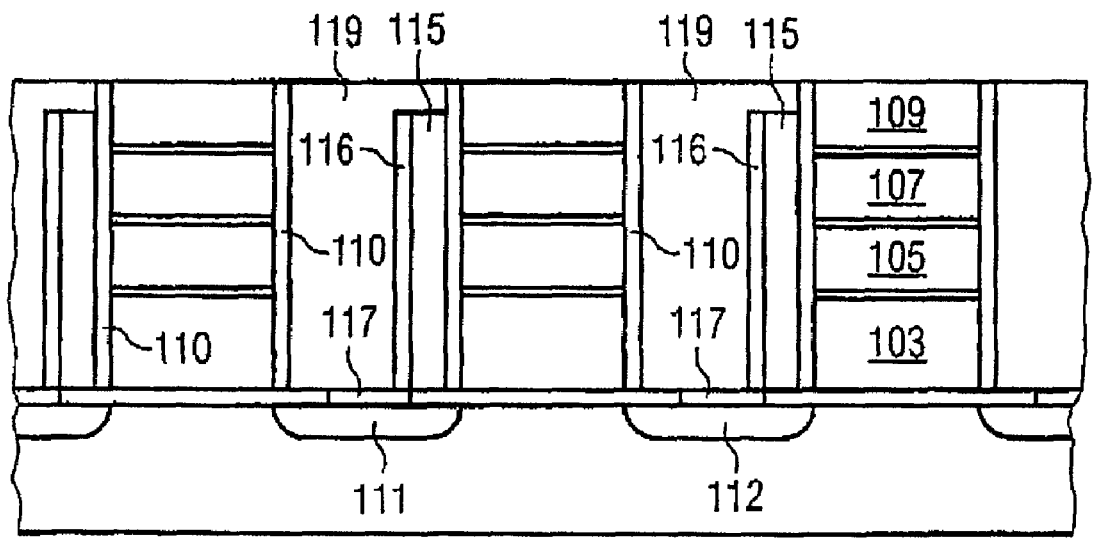

|  | Write line (WL) | Bit line (BL) | Source line (SL) |
| --- | --- | --- | --- |
| Writing | -1V | 0V | 2.5V |
| Reading | 4V | 0.5V | 0V |
| Erasing | +1V | 0V | 2.5V |

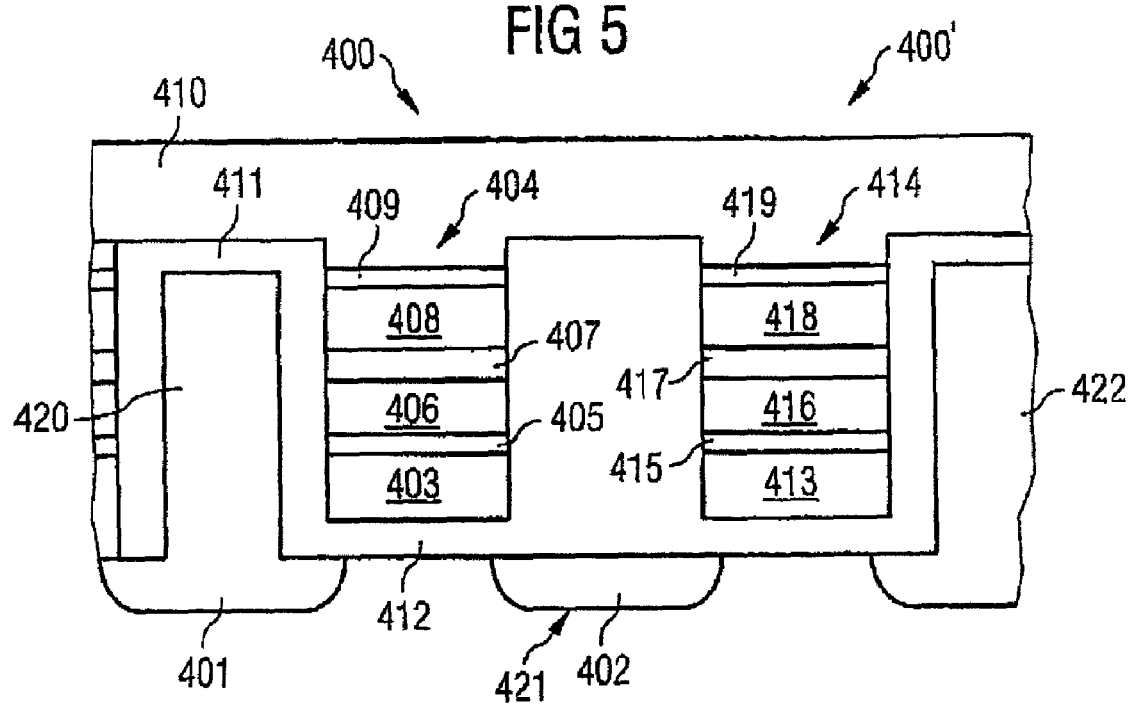
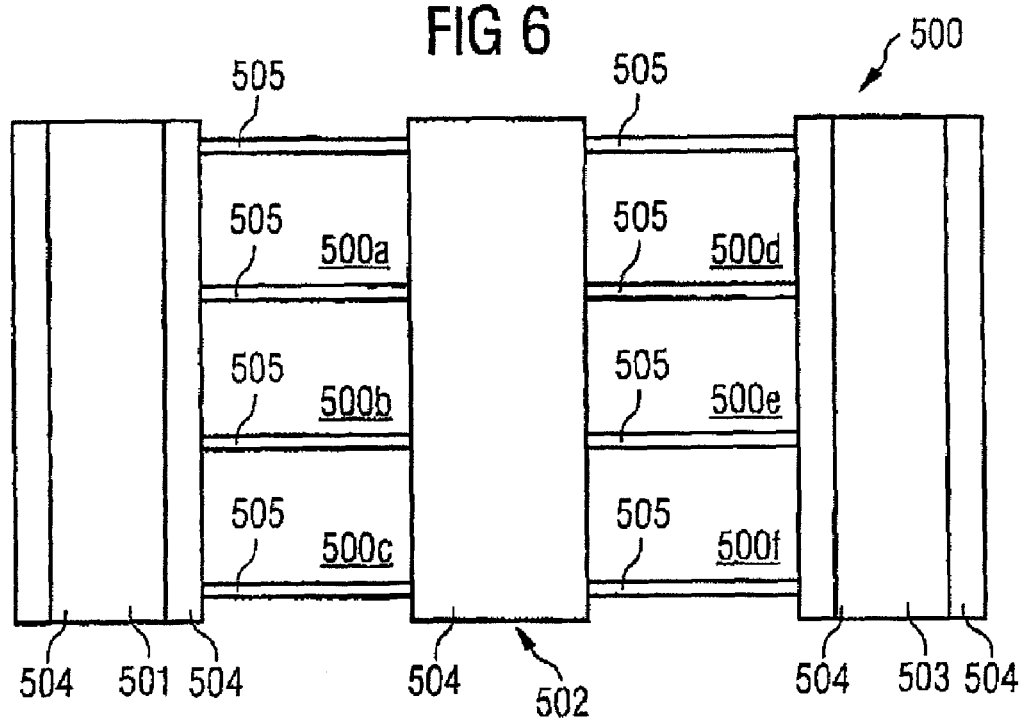

SEMICONDUCTOR MEMORY ELEMENT, SEMICONDUCTOR MEMORY ARRANGEMENT, METHOD FOR FABRICATING A SEMICONDUCTOR MEMORY ELEMENT AND METHOD FOR OPERATING A SEMICONDUCTOR MEMORY ELEMENT

CROSS REFERENCE TO RELATED APPLICATION(S)

This Utility Patent Application claims the benefit of the filing date of Application No. DE 101 43 235.6, filed Sep. 4, 2001 and International Application No. PCT/DE02/03220, filed Sep. 2, 2002, both of which are herein incorporated by reference.

BACKGROUND

The invention relates to a semiconductor memory element, a semiconductor memory element arrangement, a method for fabricating a semiconductor memory element and a method for operating a semiconductor memory element.

Some essential parameters of a semiconductor memory element are the retention time for which the memory content stored in the semiconductor memory element is preserved, the write time required for programming in the memory content, and the write voltages required for programming in the memory content.

A known semiconductor memory element is the DRAM memory element (DRAM=Dynamic Random Access Memory) which, although having relatively fast write times of a few nanoseconds, has only short retention times on account of unavoidable leakage currents, so that the RAM memory element has to be recharged at regular time intervals of about 100 ms.

By contrast, although the so-called EEPROM memory element (EEPROM=Electrically Erasable Programmable Read Only memory) enables relatively long retention times of a number of years, the write times required for programming in the memory content are significantly longer than in the case of the RAM memory element.

There is therefore a need for semiconductor memory elements in which fast write times (of about 10 nanoseconds) are combined with long retention times (of more than one year) and low write voltages.

K. K. Likharev, "Layered tunnel barriers for non-volatile memory devices", Applied Physics Letters Vol. 73, pages 2137–2139 has proposed a so-called "crested barrier" memory element, in which a floating gate is charged or discharged via a serial arrangement of (typically three) tunnel barriers, the tunnel barriers having a profiled (="crested") form. In this case, the tunnel barriers are not formed in the customary manner in the form of a square-wave potential with a constant height of the potential barrier, but rather are profiled by means of "peaks".

Since, compared with a conventional tunnel barrier, such a "profiled" tunnel barrier has a greater charge transmission and a greater sensitivity for the voltage present, relatively fast write times can be achieved theoretically in any case with such a "crested barrier" semiconductor memory element. However, the write voltages required for writing are relatively large, i.e. approximately greater than 10 V.

K. Nakazato et al., "PLED—Planar Localized Electron Devices", IEDM pages 179–182 has disclosed a proposal for a so-called PLED memory element (PLED=Planar Localized Electron Device). In this case data is written or erased by fast charging or discharging of a floating gate via a multiple tunnel barrier (MTJ=Multiple Tunnel Junction), the transmission of the multiple tunnel barrier being controlled by means of a side gate electrode. For reading data, depending on the conductivity state of the channel running below the floating gate between a source terminal and a drain terminal, a current flow is detected in the channel (corresponding to a "1" bit) or is not detected (corresponding to a "0" bit). In the case of the PLED memory element, it is possible to achieve short write times (similar to those of a RAM memory element) and long retention times (similar to those of an EEPROM memory element). Moreover, the required write voltages are significantly lower than in the case of the "crested barrier" memory element mentioned above.

However, since a further terminal is required for the side gate electrode for controlling the transmission of the tunnel barrier in addition to the source, drain and data terminals, the PLED memory element is a 4-terminal arrangement. On account of this 4-terminal arrangement, the PLED memory element has relatively large dimensions and, consequently, is not ideal for ULSI applications (ULSI=Ultra Large Scale Integration).

SUMMARY

One embodiment of, the invention addresses the problem of providing a semiconductor memory element, a semiconductor memory element arrangement, a method for fabricating a semiconductor memory element and a method for operating a semiconductor memory element that has better suitability for ULSI applications in conjunction with enabling fast write times, long retention times and low write voltages.

In one embodiment of the invention, semiconductor memory element has a substrate, in which at least one source region and at least one drain region are formed. A floating gate is electrically insulated from the substrate.

Furthermore, a tunnel barrier arrangement is provided, via which electrical charge can be fed to the floating gate or can be dissipated from the latter, it being possible to alter the conductivity of a channel between the source and drain regions by charging or discharging the floating gate.

Moreover, means for controlling the charge transmission of the tunnel barrier arrangement is provided, which has a source line that is electrically conductively connected to the source region.

By virtue of the fact that the means for controlling the charge transmission of the tunnel barrier arrangement has a source line that is electrically conductively connected to the source region, the source line can be used, on the one hand, for current transport when writing to or reading from the semiconductor memory element and, on the other hand, for controlling the charge transmission of the multiple tunnel barrier. Consequently, unlike in the case of the PLED memory element described above, there is no need for an additional terminal for a side gate which controls the charge transmission.

In other words, by virtue of the fact that the charge transmission of the tunnel barrier arrangement is controlled via the source line, it suffices, in the case of the invention's construction of the semiconductor memory element, to provide, for operation, a source line, a data line and a word line to which different voltages can be applied in each case for writing, reading and erasing.

The semiconductor memory element according to one embodiment of the invention thus has a 3-terminal arrangement and, on account of the associated narrower construction, is better suited in particular to ULSI applications than a 4-terminal arrangement, as represented e.g. by the PLED memory element described above. At the same time, the semiconductor memory element according to the invention manages with significantly lower write voltages than, for instance, the abovementioned "crested barrier" memory element.

The tunnel barrier arrangement in one embodiment has a layer stack with an alternating layer sequence of semiconducting and insulating layers for the purpose of forming a multiple tunnel barrier. In this case, the source line extends from the source region parallel to the stack direction of the layer stack of the multiple tunnel barrier. The source line additionally has doped polysilicon. As an alternative, the source line may have metal of aluminium, copper, or titanium nitride.

In accordance with one embodiment, the semiconducting layers of the layer stack have undoped polysilicon, and the insulating layers have silicon nitride or silicon dioxide.

In this case, the semiconducting layers may have a thickness in the range of typically 10 to 100 nm, and more specifically, in the range of 30 to 50 nm. The insulating layers may have a thickness in the range of typically 2 to 10 nm, and more specifically, in the range of 2 to 6 nm.

As an alternative, the semiconducting layers may also have amorphous silicon.

The tunnel barrier arrangement may be electrically connected to a word line on its side remote from the floating gate, by means of which word line a voltage pulse can be applied via the tunnel barrier arrangement to the floating gate for the purpose of charging the latter and for the purpose of inverting the channel between source region and drain region.

In a semiconductor memory element arrangement according to one embodiment of the invention, a plurality of semiconductor memory elements according to the invention are arranged in a matrix-like manner in a plurality of rows and columns, the semiconductor memory elements belonging to a column having a common source line which is electrically conductively connected to the source regions of said semiconductor memory elements and via which the charge transmission of the tunnel barrier arrangements belonging to said semiconductor memory elements can be controlled.

In this case, the source line respectively assigned to a semiconductor memory element in a row may form a bit line of a semiconductor memory element that is adjacent in the same row. In this way, it is possible to realize particularly high storage densities of $4 \times f^2$ (f="minimum feature size").

However, it is also possible for a common source line to be assigned in each case to two semiconductor memory elements that are arranged adjacent in the same row. In this case, the source line is arranged symmetrically, i.e. at the same distance with respect to the layer stacks that are adjacent on the left and right of the source line, for forming the tunnel barrier arrangement, as a result of which the fabrication process of the semiconductor memory element arrangement is simplified.

A method for fabricating a semiconductor memory element in accordance with one embodiment of the invention has the following steps:

formation of at least one source region and at least one drain region in a substrate;

formation of a floating gate that is electrically insulated from the substrate;

formation of a tunnel barrier arrangement, via which electrical charge can be fed to the floating gate or dissipated from the latter, it being possible to alter the conductivity of a channel between the source and drain regions by charging or discharging the floating gate; and a source line that is electrically conductively connected to the source region and serves for controlling the charge transmission of the tunnel barrier arrangement being formed adjacent to the tunnel barrier arrangement.

In one embodiment, the tunnel barrier arrangement is formed as a layer stack with an alternating layer sequence of semiconducting and insulating layers for the purpose of forming a multiple tunnel barrier.

The source line is formed from the source region parallel to the stack direction of the layer stack of the multiple tunnel barrier.

In one embodiment, the step of formation of a source line that is electrically conductively connected to the source region has the following steps:

application of a first semiconducting layer on an insulating layer that covers the tunnel barrier arrangement and the source region;

performance of a directional implantation for doping that region of the first semiconducting layer which is applied on the insulating layer that covers the multiple tunnel barrier;

uncovering of the source region by partial removal of the first semiconducting layer that covers the source region and of the insulating layer;

removal of the non-doped regions of the first semiconducting layer with the insulating layer being partially uncovered; and selective application of a second semiconducting layer to the source region and the doped region of the first semiconducting layer.

In one embodiment, the first and second semiconducting layers are formed from polysilicon and the insulating layer is preferably formed from silicon dioxide ($SiO_2$) or silicon nitride ($Si_3N_4$).

In one method for operating a semiconductor memory element which has a substrate with at least one source region formed therein and at least one drain region formed therein, a floating gate electrically insulated from the substrate, and a tunnel barrier arrangement, electrical charge being fed to the floating gate or dissipated from the latter via the tunnel barrier arrangement, the conductivity of a channel between source and drain regions being altered by charging or discharging the floating gate, and the charge transmission of the tunnel barrier arrangement being controlled via a source line that is electrically conductively connected to the source region.

In one embodiment of writing data to the semiconductor memory element, a voltage in the range of +(2–3) volts is applied to the source line and a voltage of at most ±1 volt is applied to a word line which is electrically connected to the tunnel barrier arrangement on its side remote from the floating gate.

The voltage of +(2–3) volts present on the source line exponentially increases the transmission of the tunnel barrier arrangement formed by the layer stack and enables electrical charge to be fed to or dissipated from the floating gate and thus an inversion of the channel situated between source and drain regions.

For reading data of the semiconductor memory element a voltage in the range of +(0.5–1) volt is applied to a bit line that is electrically conductively connected to the drain region; and a voltage in the range of +(3–5) volts is applied to a word line which is electrically connected to the tunnel barrier arrangement on its side remote from the floating gate.

On account of the capacitive coupling, the voltage of +(3–5) volts present on the word line corresponds to a voltage of typically about +1.5 volts between floating gate and the channel between source region and drain region, so that the capacitive punch-through from the word line to the floating gate and the channel between source and drain regions suffices to put the read-out transistor into the on state. Consequently, when a low voltage of +(0.5–1) volt is applied to the bit line, depending on inverted or non-inverted state of the channel, a current flow is detected in the channel (corresponding to a "1" bit) or is not detected (corresponding to a "0" bit).

Exemplary embodiments of the invention are illustrated in the figures and are explained in more detail below.

BRIEF DESCRIPTION OF THE DRAWINGS

FIGS. 1a to 1g illustrate a semiconductor memory element according to the invention in accordance with an exemplary embodiment of the invention at different states during its fabrication;

FIG. 4 illustrates a programming example for the semiconductor memory element from FIG. 2;

FIG. 5 illustrates a diagrammatic side view of a semiconductor memory element in accordance with a second preferred embodiment; and FIG. 6 illustrates a diagrammatic illustration of a semiconductor memory element arrangement of six semiconductor memory elements constructed in accordance with FIG. 5, in plan view.

DETAILED DESCRIPTION

Figure 1A:
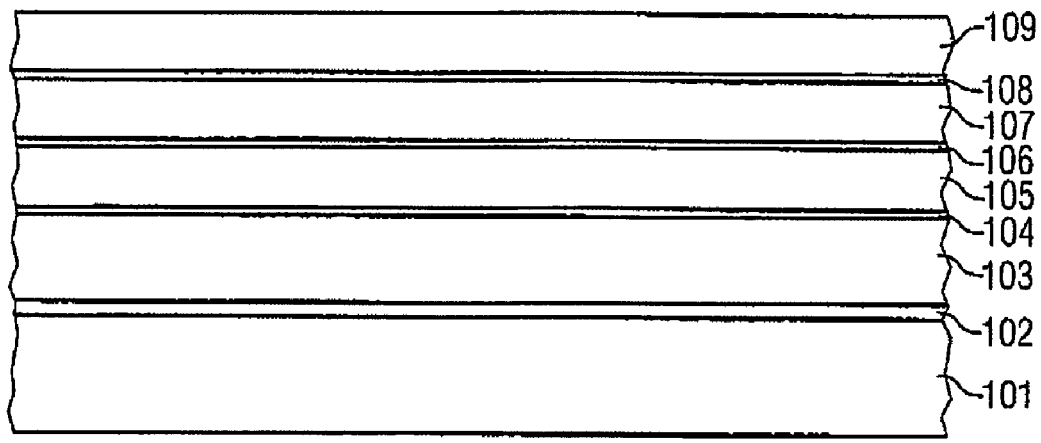

In accordance with FIG. 1a, a layer 102 made of silicon dioxide with a thickness of about 6–10 nm and a layer 103 made of doped polysilicon with a thickness of 50 nm are grown one after the other in order to fabricate a semiconductor memory element 100 on a silicon substrate 101. The layer 103 serves for forming a floating gate of the semiconductor memory element 100.

Barrier layers 104, 106 and 108 made of silicon nitride ($Si_3N_4$) and layers 105, 107 and 109 made of undoped polysilicon are applied in an alternating layer sequence on the layer 103, this preferably being performed by means of chemical vapour deposition (CVD) or thermal nitriding. The layer stack formed from the layers 103–108 serves for forming a multiple tunnel barrier, it being possible for the multiple tunnel barrier also to have a different number of barrier layers and polysilicon layers, but at least one barrier layer and two polysilicon layers separated by the barrier layer.

In the exemplary embodiment illustrated, the undoped polysilicon layers 105 and 107 have a thickness of 40 nm, the doped polysilicon layer 109 has a thickness of 50 nm, the barrier layers 104 and 108 have a thickness of 2 nm and the barrier layer 106 has a thickness of approximately 5 nm.

Figure 1B:
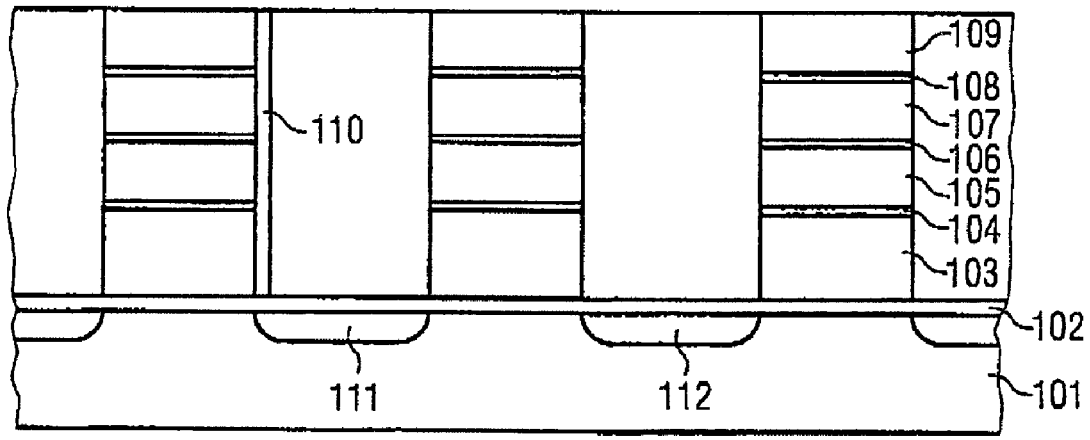

In a next step, in accordance with FIG. 1b, after the etching of the "layer stack" of polysilicon and silicon nitride layers 103–109, with a silicon dioxide layer 110 having a thickness of about 6 nm, a directional arsenic implantation with a dose of about $10^{20}$ cm$^{-3}$ is performed for the purpose of forming source and drain regions 111, 112 in the substrate 101, symbolized by means of arrows 123 in FIG. 1b. In this case, the silicon dioxide layer 110 serves to prevent doping atoms from penetrating into the layer stack 103–109.

Figure 1C:
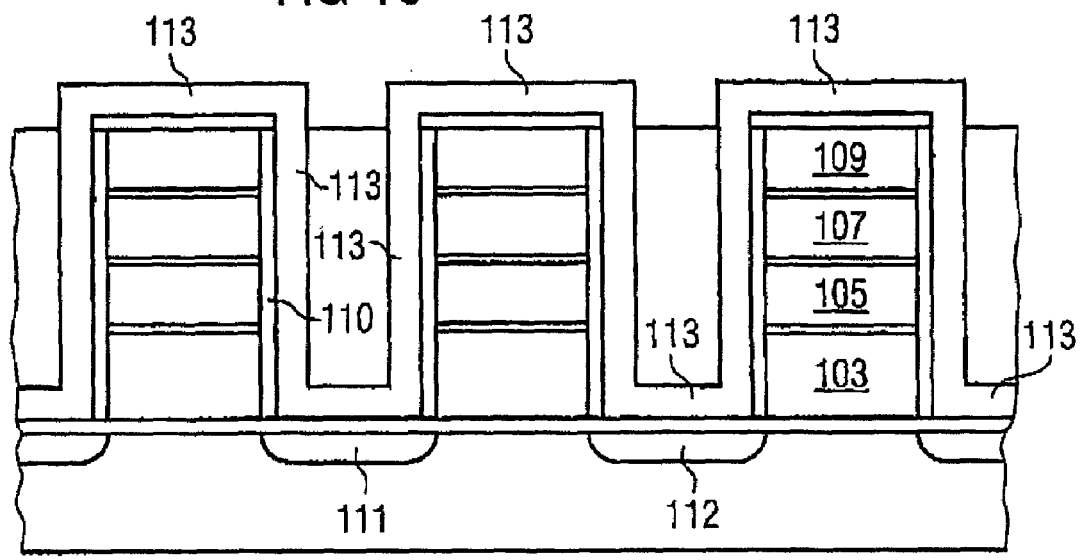

Afterward, in accordance with FIG. 1c, a layer 113 made of polysilicon, whose thickness corresponds to approximately f/4 (f=minimum feature size), is applied to the silicon dioxide layer 110 and the silicon dioxide layer 102 extending between the layer stacks 103–109.

Figure 1D:
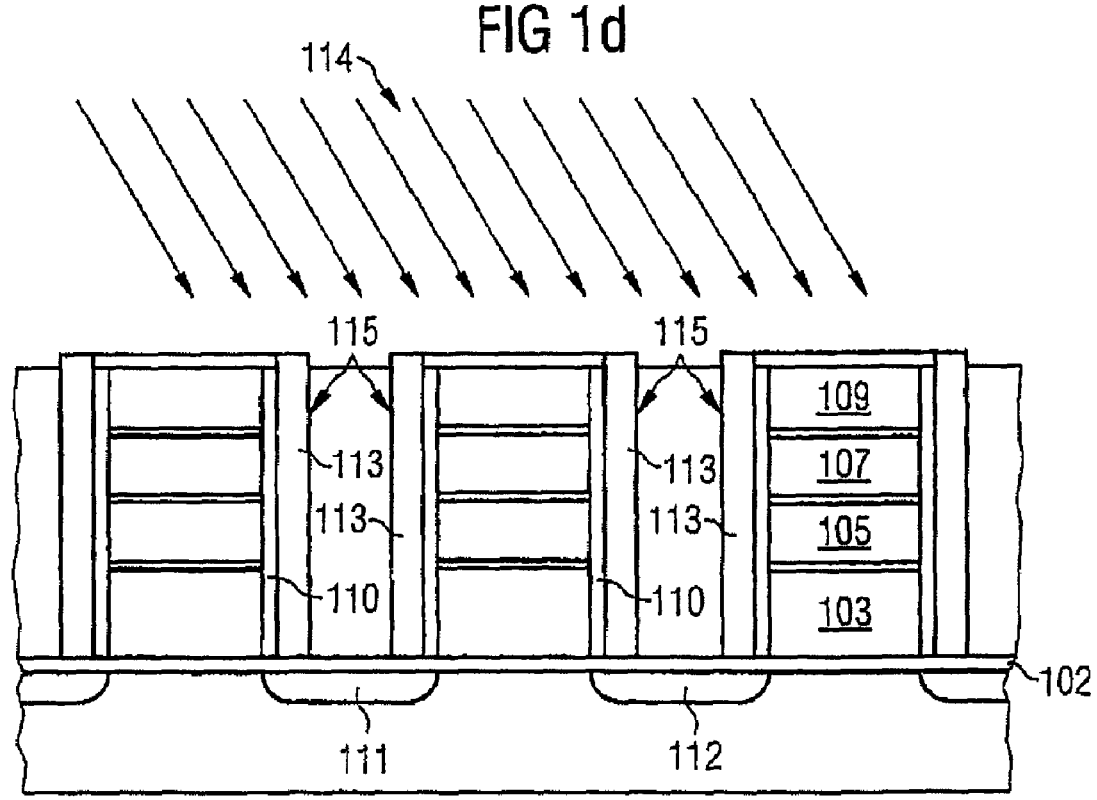

In a next step, an obliquely directed implantation of boron atoms 114 is performed, as can be seen from FIG. 1d, (i.e. only onto the respective regions shown on the right in the trenches in FIG. 1d). After this one-sided boron implantation, polysilicon spacers 115 are formed from the layer 113 made of polysilicon by means of an etching step, whereupon a rapid thermal treatment (RTP=rapid thermal process) is performed in order to achieve activation of the boron doping atoms at the correct lattice sites.

Afterward, the silicon dioxide layer 102 extending between the polysilicon spacers 115 is partially etched away (FIG. 1d), whereupon a further wet-chemical etching step is performed using potassium hydroxide (KOH). This etching step serves for removing only the non-doped regions of the polysilicon spacers 115 (i.e. the respective regions shown on the left in the trenches in FIG. 1d) with the underlying silicon dioxide layer 110 being uncovered.

In a next step, in accordance with FIG. 1e, a selective epitaxy of polysilicon is performed, polysilicon being applied only in the regions in which there is no silicon dioxide, i.e. in the regions shown on the right in FIG. 1e within each trench structure and also above the source and drain regions 111, 112, since the silicon dioxide layer 110 has previously been removed there. Consequently, a layer 116 and 117, respectively, made of polysilicon is applied on these regions, the thickness of the layer 117 above the source and drain regions being about 10 nm, but in any event amounting to at least the thickness of the surrounding silicon dioxide layer 110.

Afterward, in accordance with FIG. 1e, an obliquely directed implantation of phosphorus ions 118 is performed. In a next step, silicon dioxide 119 is applied to fill the trench structure, whereupon a chemical mechanical polishing (CMP) is performed.

In a next step, in accordance with FIG. 1f, the topmost region of the polysilicon layers 116 and 117, which region lies at the level of the polysilicon layer 109, is partly etched back, whereupon the corresponding region is again filled with silicon dioxide 119 and a further CMP step is performed.

Figures 1G, 4:
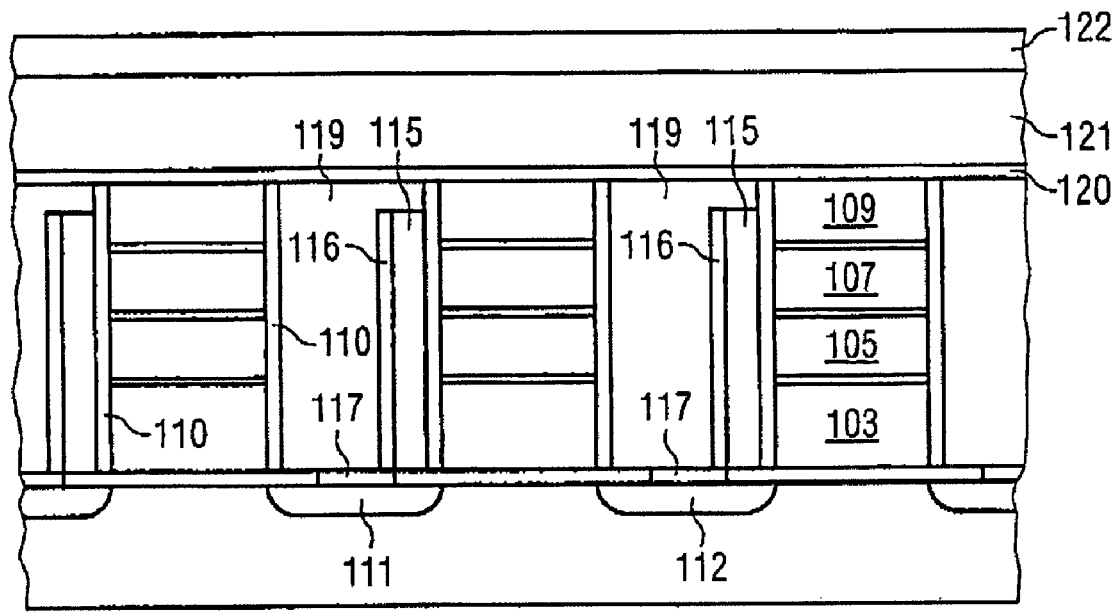

Afterward, a titanium/titanium nitride layer 120 is applied for the purpose of forming a diffusion barrier on the layers 119 and 109, and on it in turn there are successively deposited a layer 121 made of tungsten and a layer 122 of silicon nitride ($Si_3N_4$) for the purpose of forming the semiconductor memory element 100 illustrated in FIG. 1g.

Afterward, the layer stack comprising the layers made of silicon nitride, tungsten and the barrier layer made of polysilicon is etched down to the layer 102 made of silicon dioxide. The layer made of silicon nitride, which is arranged on the layer made of tungsten, serves as a hard mask in this etching operation. By means of this etching step, the structures are separated in the y-direction, i.e. in the direction perpendicular to the plane of the drawing from FIG. 1g.

Figure 2:
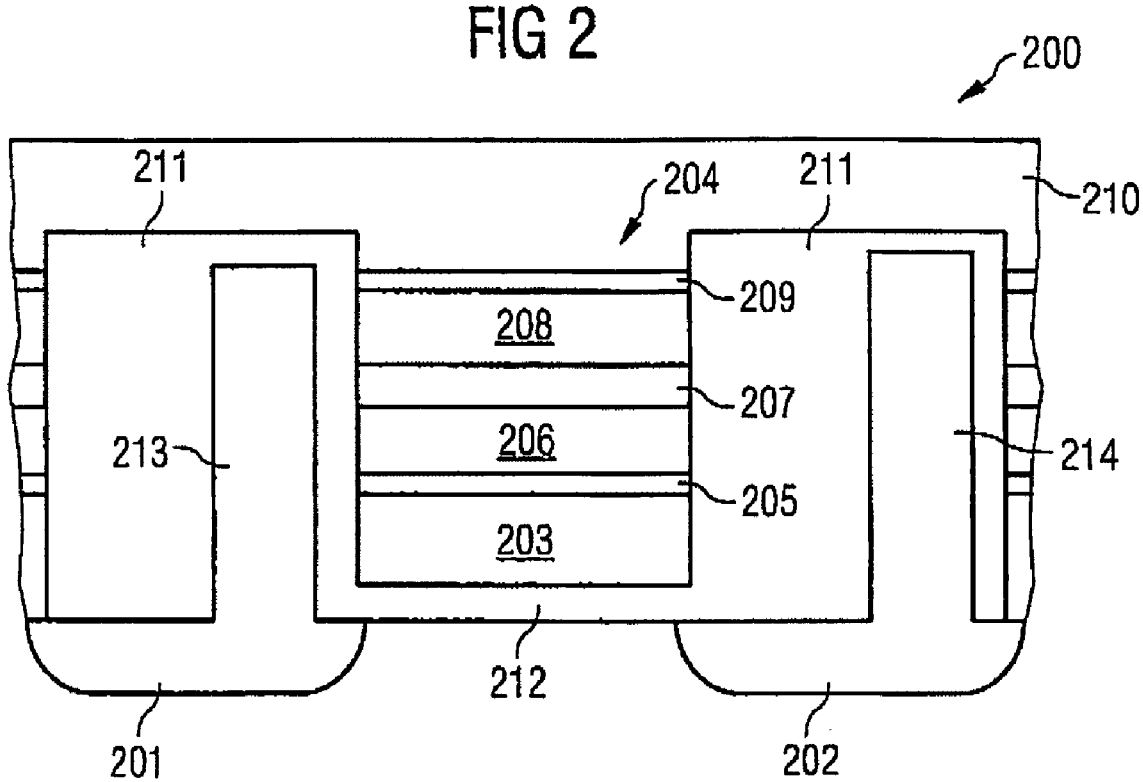
FIG. 2 illustrates a diagrammatic side view of a semiconductor memory element in accordance with a first preferred embodiment.

In accordance with FIG. 2, a semiconductor memory element 200 fabricated in accordance with the method described above has source and drain regions 201, 202 which are formed in a substrate (not illustrated) and between which extends a channel (not illustrated) with variable electrical conductivity in the substrate.

Furthermore, the semiconductor memory element 200 has a floating gate 203 made of a polysilicon layer having a thickness of about 50 nm, on which a layer stack 204 with alternately successive silicon nitride layers 205, 207 and 209 and polysilicon layers 206 and 208 is successively applied for the purpose of forming a multiple tunnel barrier.

A tungsten layer 210 for forming a word line of the semiconductor memory element 200 is applied on the topmost silicon nitride layer 209.

In the region that does not adjoin the tungsten layer 210, the floating gate 203 and the layer stack 204 are surrounded by a silicon dioxide region 211, via which the semiconductor memory element 200 is insulated from adjacent semiconductor memory elements. The silicon dioxide region 211 has, in particular, a silicon dioxide layer 212, which insulates the floating gate 203 from the substrate.

Furthermore, provision is made of a source line 213 made of $n^+$-doped polysilicon which extends adjacent to the floating gate 203 and the layer stack 204 from the source region 201, and a bit line 214 made of $n^+$-doped polysilicon which extends parallel to said source line on the opposite side of the floating gate 203 and of the layer stack 204 from the drain region 202.

In the case of the semiconductor memory element 200 which is illustrated in FIG. 2 and fabricated in accordance with the method illustrated in FIGS. 1a–g, the position of the source line 213 is asymmetrical in so far as said source line, as can be seen from FIG. 2, is arranged significantly nearer to the layer stack 204 forming the tunnel barrier arrangement than to the corresponding layer stack situated on the opposite side of the source line 213 (i.e. on the left in FIG. 2). Although this increases the fabrication outlay compared with a symmetrical arrangement of the source line 213 (which will be described in connection with FIG. 4), it is ensured, when suitable voltages are applied to the source line, that exclusively the nearest adjacent tunnel barrier arrangement is "opened", i.e. the vertical transmission thereof is increased.

Moreover, in the exemplary embodiment of a semiconductor memory element 200 as illustrated in FIG. 2, the source line 213 simultaneously serves as a bit line for an adjacent semiconductor memory element which is arranged on that side of the source line 213 which is remote from the floating gate 203 (i.e. to the left of the source line 213 in FIG. 2). In this way, it is possible to realize particularly high storage densities of $4 \times f^2$ (f="minimum feature size").

Figure 3:
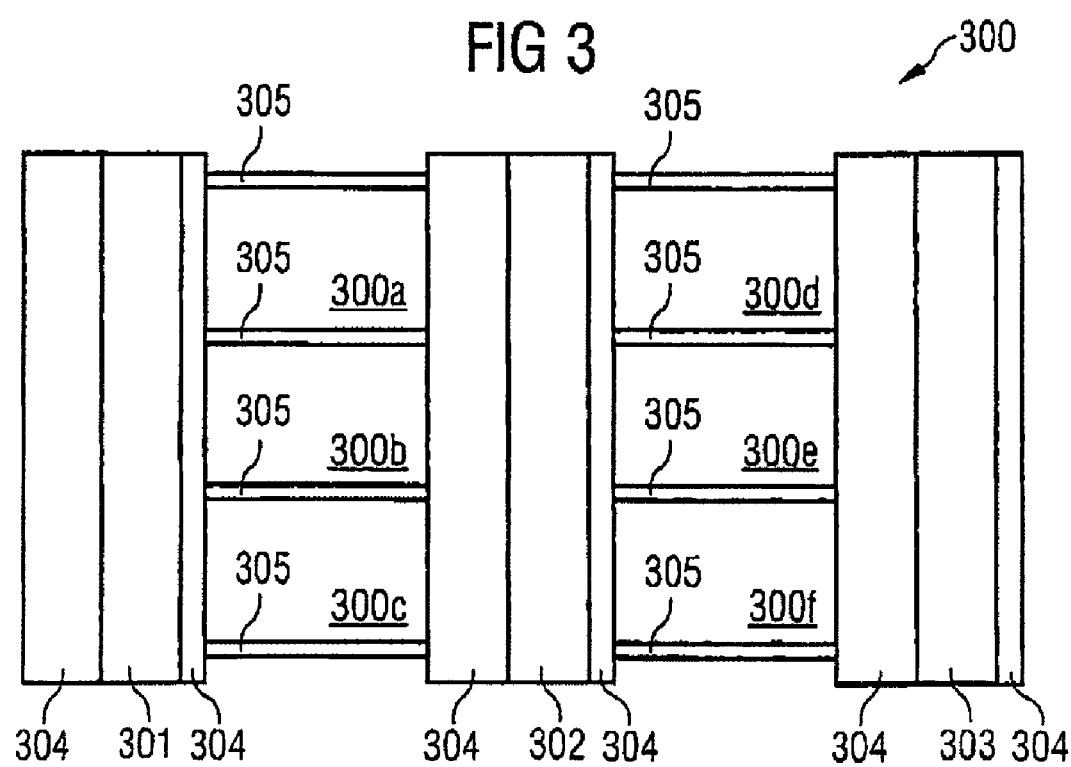
FIG. 3 shows a diagrammatic illustration of a semiconductor memory element arrangement of six semiconductor memory elements constructed in accordance with FIG. 2, in plan view.

FIG. 3 illustrates a grid structure 300 of a semiconductor memory element arrangement, in which floating gates 300a . . . 300d belonging to four semiconductor memory elements are arranged in a grid arrangement, each of the semiconductor memory elements 300a–300d being constructed identically to the semiconductor memory element 200 from FIG. 2. Accordingly, a source line 301 runs adjacent to the floating gates 300a–300b on the side thereof which is remote from the floating gates 300a–300b, and a bit line 302 runs on the side thereof which faces the floating gates 300a–300b. A source line 303 in turn runs on that side of the floating gates 300c–300d which is remote from the floating gates 300a–300b.

The floating gates 300a–300d are surrounded by a silicon dioxide region 304 and, in the interspaces remaining between adjacent floating gates 300a–300d, are isolated by silicon dioxide layers 305 in order to insulate adjacent semiconductor memory elements from one another.

In order to explain the method of operation of the semiconductor memory element 200, FIG. 4 illustrates a programming example of the semiconductor memory element 200. Accordingly, the write process is effected by applying a positive voltage of +2.5 volts to the source line 213 in order to open the channel and applying a negative voltage of −1 volt to the word line 210 (write line). Data are correspondingly erased by applying a positive voltage of +1 volt to the word line 210 and applying a positive voltage of +2.5 volts to the source line 213.

The voltage of +2.5 volts present on the source line 213 increases the charge transmission of the tunnel barrier arrangement formed by the layer stack 204 and enables electrical charge to be fed to or dissipated from the floating gate 203 and thus an inversion of the channel situated between source and drain regions 201, 202.

The read process is effected by applying a positive voltage of, for example, +4 volts to the word line 210 and applying a low positive voltage of, for example, +0.5 volt to the bit line 214. On account of the capacitive coupling, a voltage of about +1.5 volts between floating gate 203 and the channel between source region 201 and drain region 202 corresponds to the voltage of +4 volts present on the word line 210, so that the capacitive punch-through from the word line 210 to the floating gate 203 and the channel between source and drain regions 201, 202 suffices to put the read-out transistor into the on state.

Consequently, when a low voltage of +0.5 volt is applied to the bit line, depending on the inverted or noninverted state of the channel, a current flow in the channel is detected (corresponding to a "1" bit) or is not detected (corresponding to a "0" bit).

FIG. 5 illustrates a semiconductor memory element 400 in accordance with a further embodiment of the invention. Like the semiconductor memory element 200, the semiconductor memory element 400 has source and drain regions 401 and 402, respectively, between which a floating gate 403 is arranged. A layer stack 404 with alternately successive silicon nitride layers 405, 407 and 409 and polysilicon layers 406 and 408 is applied on the floating gate 403 for the purpose of forming a multiple tunnel barrier.

A tungsten layer 410 for forming a word line of the semiconductor memory element 400 is applied on the topmost silicon nitride layer 409.

In the region that does not adjoin the tungsten layer 410, the floating gate 403 and the layer stack 404 are surrounded by a silicon dioxide region 411, via which the semiconductor memory element 400 is insulated from adjacent semiconductor memory elements. The silicon dioxide region 411 has, in particular, a silicon dioxide layer 412, which insulates the floating gate 403 from the substrate.

The semiconductor memory element 400 is adjoined by a further semiconductor memory element 400', which, in a corresponding manner, has a floating gate 413 and a layer stack 414 with alternately successive silicon nitride layers 415, 417 and 419 and polysilicon layers 416 and 418.

Furthermore, in the semiconductor memory element 400, provision is made of a source line 420 made of $n^+$-doped polysilicon which extends adjacent to the floating gate 403 and the layer stack 404 from the source region 401. On the opposite side of the floating gate 403 and of the layer stack 404, the drain region 402 forms a bit line 421.

In contrast to the semiconductor memory element 200, in the case of the semiconductor memory element 400, the bit line 421 does not form the source line for the adjacent semiconductor memory element 400', but rather is formed from this as a separate line. Rather, the adjacent semiconductor memory element 400' has a dedicated source line 422, which is only partly illustrated in FIG. 5, so that the storage density of the semiconductor memory element 400 is only 8×f². Unlike in the case of the semiconductor memory element 200, however, in the case of the semiconductor memory element 400, the source line 420 is arranged symmetrically, i.e. at the same distance from the layer stacks adjacent on the left and right of the source line 420. In this way, the fabrication process is simplified compared with the process described in FIGS. 1a–g.

FIG. 6 illustrates a grid structure 500, in which floating gates 500a . . . 500d belonging to four semiconductor memory elements are connected to one another in a grid arrangement, each of the semiconductor memory elements 500a–500d being constructed identically to the semiconductor memory element 400 from FIG. 5. Accordingly, a source line 501 runs adjacent to the floating gates 500a–500b on the side thereof which is remote from the floating gates 500c–500d, and a bit line 502 runs on the side thereof which faces the floating gates 300c–300d. A source line 303 in turn runs on that side of the floating gates 500c–500d which is remote from the floating gates 500a–500b.

The floating gates 500a–500d are surrounded by a silicon dioxide region 504 and, in the interspaces remaining between adjacent floating gates 500a–500d, are isolated by silicon dioxide layers 505 in order to insulate adjacent semiconductor memory elements from one another.

The operation of the semiconductor memory element 400 or the semiconductor memory element arrangement in accordance with FIG. 6 essentially corresponds to that of the semiconductor memory element 200, but when a voltage of, for example, +2.5 volts is applied to the source line 420, both adjacent tunnel barrier arrangements are "opened", i.e. their vertical transmission is increased. However, in the case of the semiconductor memory element 400, too, selective writing or erasing can be effected by applying a low voltage of e.g. +/−1 volt to the respective word line.

In all the exemplary embodiments illustrated, the source line can in each case be used, on the one hand, for current transport when writing to or reading from the semiconductor memory element and, on the other hand, for controlling the charge transmission of the multiple tunnel barrier, so that there is no need for an additional terminal for a side gate which controls the charge transmission through the multiple tunnel barrier. Rather, the charge transmission of the tunnel barrier arrangement is controlled via the source line, so that the semiconductor memory element according to the invention has a 3-terminal arrangement and is thus particularly suitable for ULSI applications.

What is claimed is:

1. A semiconductor memory element, comprising:
a substrate, in which at least one source region and at least one drain region are formed;
a floating gate electrically insulated from the substrate;
a tunnel barrier arrangement, via which electrical charge can be fed to the floating gate or dissipated from the latter, it being possible to alter the conductivity of a channel between the source and drain regions by charging or discharging the floating gate;
means for controlling the charge transmission of the tunnel barrier arrangement; and
wherein the means for controlling the charge transmission of the tunnel barrier arrangement has a source line which is electrically conductively connected to the source region extending from the source region parallel to the stack direction of the layer stack of the multiple tunnel barrier.

2. The semiconductor memory element of claim 1, the tunnel barrier arrangement having a layer stack with an alternating layer sequence of semiconducting and insulating layers for the purpose of forming a multiple tunnel barrier.

3. The semiconductor memory element of claim 1, the source line having doped polysilicon or a metal.

4. The semiconductor memory element of claim 2, the semiconducting layers of the layer stack having undoped polysilicon.

5. The semiconductor memory element of claims 2, the insulating layers of the layer stack having silicon nitride or silicon dioxide.

6. The semiconductor memory element of claims 2, the semiconducting layers of the layer stack having a thickness in the range of 10 to 100 nm and the insulating layers having a thickness in the range of 2 to 10 nm.

7. The semiconductor memory element of claim 6, the semiconducting layers of the layer stack having a thickness in the range of 30 to 50 nm and the insulating layers having a thickness in the range of 2 to 6 nm.

8. The semiconductor memory element of claims 1, the tunnel barrier arrangement being electrically connected to a word line on its side remote from the floating gate, by means of which word line a voltage pulse can be applied via the tunnel barrier arrangement to the floating gate for the purpose of charging the latter and for the purpose of inverting the channel between source region and drain region.

9. The semiconductor memory element of claim 1 and at least one additional like semiconductor memory element arranged in a matrix-like manner in a plurality of rows and columns, the semiconductor memory elements belonging to a column having a common source line which is electrically conductively connected to the source regions of said semiconductor memory elements and via which the charge transmission of the tunnel barrier arrangements belonging to said semiconductor memory elements can be controlled.

10. The semiconductor memory element arrangement of claim 9, the source line respectively assigned to a semiconductor memory element in a row forming a bit line of a semiconductor memory element that is adjacent in the same row.

11. The semiconductor memory element arrangement of claim 9, a common source line being assigned in each case to two semiconductor memory elements that are arranged adjacent in the same row.

12. A method for fabricating a semiconductor memory element comprising:
forming at least one source region and at least one drain region in a substrate;
forming a floating gate that is electrically insulated from the substrate;
forming a tunnel barrier arrangement, via which electrical charge can be fed to the floating gate or dissipated from the latter, it being possible to alter the conductivity of a channel between the source and drain regions by charging or discharging the floating gate; and
providing a source line that is electrically conductively connected to the source region and serves for controlling the charge transmission of the tunnel barrier arrangement being formed adjacent to the tunnel barrier arrangement, said source line being formed from the source region parallel to the stack direction of the layer stack of the multiple tunnel barrier.

13. The method of claim 12, the tunnel barrier arrangement being formed as a layer stack with an alternating layer sequence of semiconducting and insulating layers for the purpose of forming a multiple tunnel barrier.

14. The method of claim 12, the step of formation of a source line that is electrically conductively connected to the source region comprising:

application of a first semiconducting layer on an insulating layer that covers the tunnel barrier arrangement and the source region;

performance of a directional implantation for doping that region of the first semiconducting layer which is applied on the insulating layer that covers the multiple tunnel barrier;

uncovering of the source region by partial removal of the first semiconducting layer that covers the source region and of the insulating layer;

removal of the non-doped regions of the first semiconducting layer with the insulating layer being partially uncovered; and selective application of a second semiconducting layer to the source region and the doped region of the first semiconducting layer.

15. The method of claim 14, the first and second semiconducting layers being formed from polysilicon and the insulating layer being formed from silicon dioxide.

16. A method for operating a semiconductor memory element which has a substrate with at least one source region formed therein and at least one drain region formed therein, a floating gate electrically insulated from the substrate, and a tunnel barrier arrangement, comprising:

feeding an electrical charge to the floating gate or dissipated from the latter via the tunnel barrier arrangement;

altering the conductivity of a channel between source and drain regions by charging or discharging the floating gate; and controlling the charge transmission of the tunnel barrier arrangement via a source line that is electrically conductively connected to the source region, the source line being formed from the source region parallel to the stack direction of the layer stack of the multiple tunnel barrier.

17. The method of claim 16, for writing data of the semiconductor memory element further comprising:

applying a voltage in the range of +(2–3) volts to the source line; and applying a voltage of at most ±1 volt to a word line which is electrically connected to the tunnel barrier arrangement on its side remote from the floating gate.

18. The method of claim 16, for reading data of the semiconductor memory element further comprising:

applying a voltage in the range of +(0.5–1) volt to a bit line that is electrically conductively connected to the drain region; and applying a voltage in the range of +(3–5) volts to a word line which is electrically connected to the tunnel barrier arrangement on its side remote from the floating gate.

* * * * *

UNITED STATES PATENT AND TRADEMARK OFFICE
CERTIFICATE OF CORRECTION

PATENT NO. : 7,157,767 B2
APPLICATION NO. : 10/486184
DATED : January 2, 2007
INVENTOR(S) : Michael Specht and Franz Hofmann Page 1 of 1

It is certified that error appears in the above-identified patent and that said Letters Patent is hereby corrected as shown below:

First page, second column, below "References Cited" and "FOREIGN PATENT DOCUMENTS" insert
--OTHER PUBLICATIONS
An article entitled "Layered Tunnel Barriers for Nonvolatile Memory Device" (Konstantin K. Likharev, American Institute of Physics, 1998, pp. 2137-2139).

An article entitle "PLED-Planar Localised Electron Devices" (Kazuo Nakazato et al., IEEE, 1997, pp. 179-182).--.

Column 9, line 59, delete "element," and insert in place thereof --element--.

Column 10, line 18, delete "claims" and insert in place thereof --claim--.

Column 10, line 21, delete "claims" and insert in place thereof --claim--.

Column 10, line 29, delete "claims" and insert in place thereof --claim--.

Signed and Sealed this

Sixth Day of January, 2009

JON W. DUDAS
*Director of the United States Patent and Trademark Office*